(12) United States Patent
Johnson

(10) Patent No.: US 10,886,918 B2
(45) Date of Patent: Jan. 5, 2021

(54) SYSTEMS AND METHODS FOR IMPEDANCE CALIBRATION OF A SEMICONDUCTOR DEVICE

(71) Applicant: Micron Technology, Inc., Boise, ID (US)

(72) Inventor: Jason M. Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/397,797

(22) Filed: Apr. 29, 2019

(65) Prior Publication Data

US 2020/0059232 A1 Feb. 20, 2020

Related U.S. Application Data

(63) Continuation of application No. 16/104,374, filed on Aug. 17, 2018, now Pat. No. 10,439,612.

(51) Int. Cl.
*H03K 19/00* (2006.01)
*G11C 7/10* (2006.01)

(52) U.S. Cl.
CPC .......... *H03K 19/0005* (2013.01); *G11C 7/10* (2013.01); *G11C 2207/2254* (2013.01)

(58) Field of Classification Search
None
See application file for complete search history.

(56) References Cited

U.S. PATENT DOCUMENTS

| | | |
|---|---|---|
| 9,871,517 B1 | 1/2018 | Cheng et al. |
| 9,935,632 B1 | 4/2018 | Gans |
| 2012/0056641 A1* | 3/2012 | Kuroki ........... H03K 19/017545 326/30 |
| 2014/0266299 A1 | 9/2014 | Seol et al. |
| 2015/0063041 A1* | 3/2015 | Arai ..................... G11C 7/1051 365/189.05 |
| 2015/0340069 A1 | 11/2015 | Arai et al. |
| 2016/0179113 A1 | 6/2016 | Taigor et al. |
| 2016/0254812 A1* | 9/2016 | Miwa ................. H03K 19/0005 326/30 |

OTHER PUBLICATIONS

Taiwan Office Action dated Nov. 6, 2019; TW Application No. 108114858.
PCT International Search Report & Written Opinion for PCT Application No. PCT/US2019/027962 dated Aug. 5, 2019; 10 Pages.

* cited by examiner

*Primary Examiner* — Seokjin Kim
(74) *Attorney, Agent, or Firm* — Fletcher Yoder, P.C.

(57) ABSTRACT

Systems and methods for performing an efficient ZQ calibration are provided herein. The described techniques use non-linearity compensation circuitry configured to compensate for a non-linear relationship between variation in a plurality of ZQ calibration codes and corresponding resistance variations, by adjusting either: a magnitude of the adjustment to the calibration step, the ZQCODE to an alternative ZQCODE, or both the magnitude of the adjustment to the calibration step and the ZQCODE to the alternative ZQCODE.

22 Claims, 18 Drawing Sheets

SYSTEMS AND METHODS FOR IMPEDANCE CALIBRATION OF A SEMICONDUCTOR DEVICE

CROSS REFERENCE TO RELATED APPLICATIONS

This application is a Continuation and claims priority to U.S. patent application Ser. No. 16/104,374, filed Aug. 17, 2018, which is herein incorporated by reference.

BACKGROUND

Field of the Present Disclosure

Embodiments of the present disclosure relate generally to the field of semiconductor devices. More specifically, embodiments of the present disclosure relate to calibrating impedance of a semiconductor device.

Description of Related Art

A semiconductor device, such as a microcomputer, memory, gate array, among others, may include input/output (I/O) pins and an output circuit for transmitting data to other devices, via a bus, transmission lines formed on a board, and the like. The semiconductor device may include a circuit that controls transmitting the data and may include, for example, output buffers and drivers. To consistently and accurately transmit data, an impedance of the semiconductor device may be matched to an impedance of a transmission network and/or a receiving device.

A semiconductor device, such as low power dynamic random access memory (LPDRAM) devices (and other similar semiconductor devices), may use a ZQ calibration process to tune certain components of the semiconductor device, such as a dynamic random access memory (DRAM), input/output (I/O) drivers, and/or on-die termination components, across changes in process, voltage, and/or temperature. In particular, the ZQ calibration process may use a periodic (as commanded by a memory controller) calibration to compare the components with reference values to maintain consistent impedance across process, voltage, and/or temperature. However, the ZQ calibration process may lose accuracy if voltage conditions are not consistent.

For example, a PMIC (power management integrated circuit) may supply a voltage to and/or manage power in the semiconductor device. The supply voltage may include a period and frequency, and also include a DC (direct current) ripple or variation that may distort calibration by as much as a full DC amplitude of the source voltage. The frequency of the supply voltage may be much higher than a frequency of the calibration, while the period of the supply voltage may be longer than is practical for a single calibration event to average.

Accordingly, embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
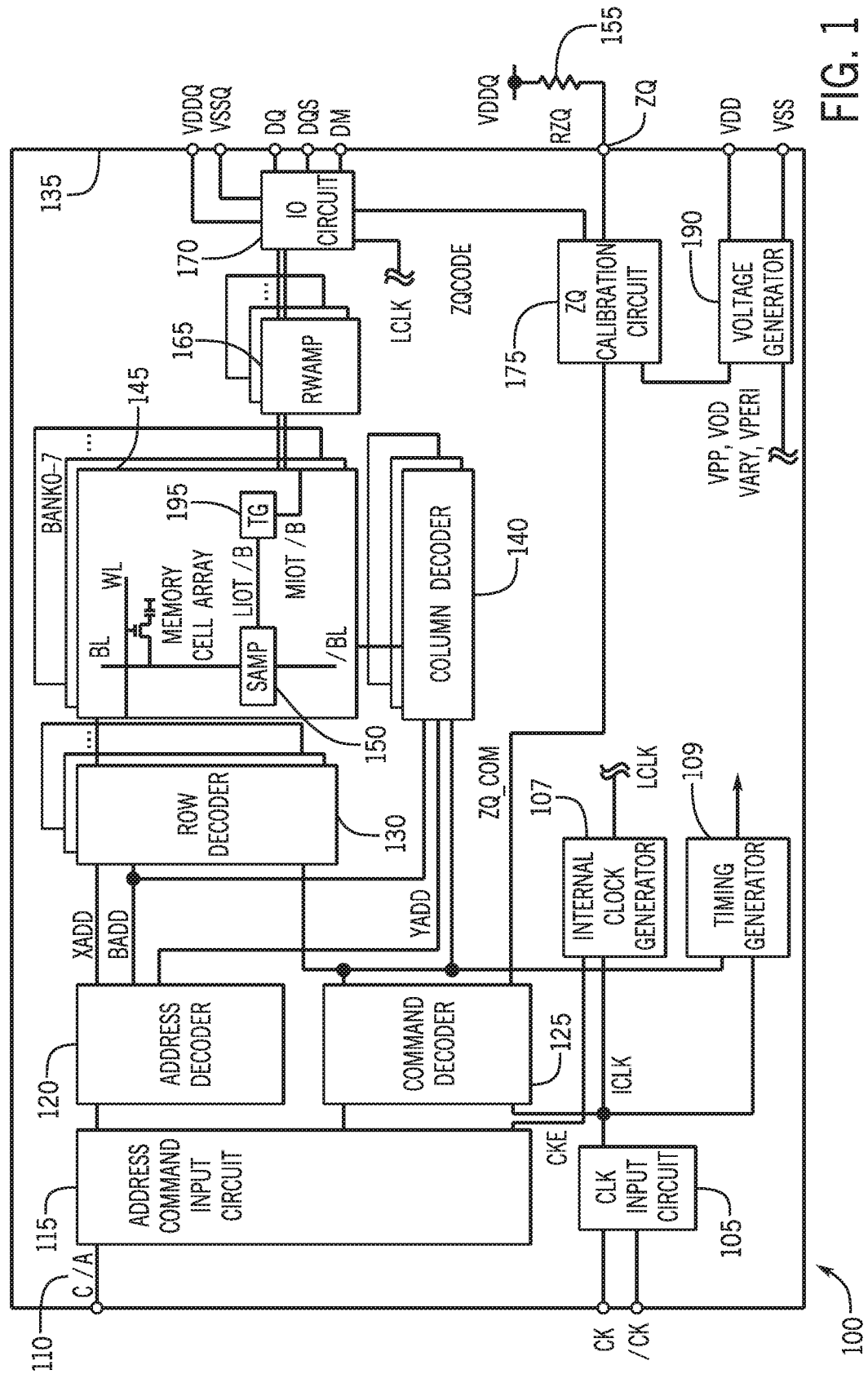
FIG. 1 is a schematic block diagram of a semiconductor memory device, in accordance with an embodiment of the present disclosure.

FIG. 1 is a schematic block diagram of a semiconductor memory device 100, in accordance with an embodiment of the present disclosure. For example, the semiconductor memory device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, a ZQ calibration circuit 175, and a voltage generator 190. The semiconductor memory device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate, for example, a memory module substrate, a mother board or the like.

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside of the semiconductor memory device 100 at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside of the semiconductor memory device 100, such as, for example, a memory controller at the command/address terminals via the command/address bus 110 and provide the command signal to the command decoder 125. The command decoder 125 may decode the command signal and provide or generate various internal command signals. For example, the internal command signals may include a row command signal to select a word line, a column command signal, such as a read command or a write command, to select a bit line, and a ZQ calibration command that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the TO circuit 170. The IO circuit 170 may provide the read data DQ to outside of the semiconductor memory device 100 via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor memory device 100, the clock terminals CK and/CK may receive an external clock signal and a complementary external clock signal, respectively. The external clock signals (including the complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may be mounted on a substrate that is coupled to the calibration terminal ZQ. For example, the ZQ resistor (RZQ) 155 may be coupled to a power supply voltage (VDDQ). An impedance code (ZQCODE) obtained by the calibration operation may be provided to the IO circuit 170, and thus an impedance of an output buffer (not shown) included in the IO circuit 170 is specified. In some examples, the ZQ calibration circuit 175 may include a dynamic adder/subtractor circuit that dynamically selects step sizes of adjustments to the ZQCODE during the calibration operation. The selection of the step size adjustments may be based on a current value of the ZQCODE. By using a dynamic adder/subtractor circuit, the calibration operation time may be reduced when calibrating a driver of the I/O circuit 170 that has a non-linear impedance curve.

Figure 3:
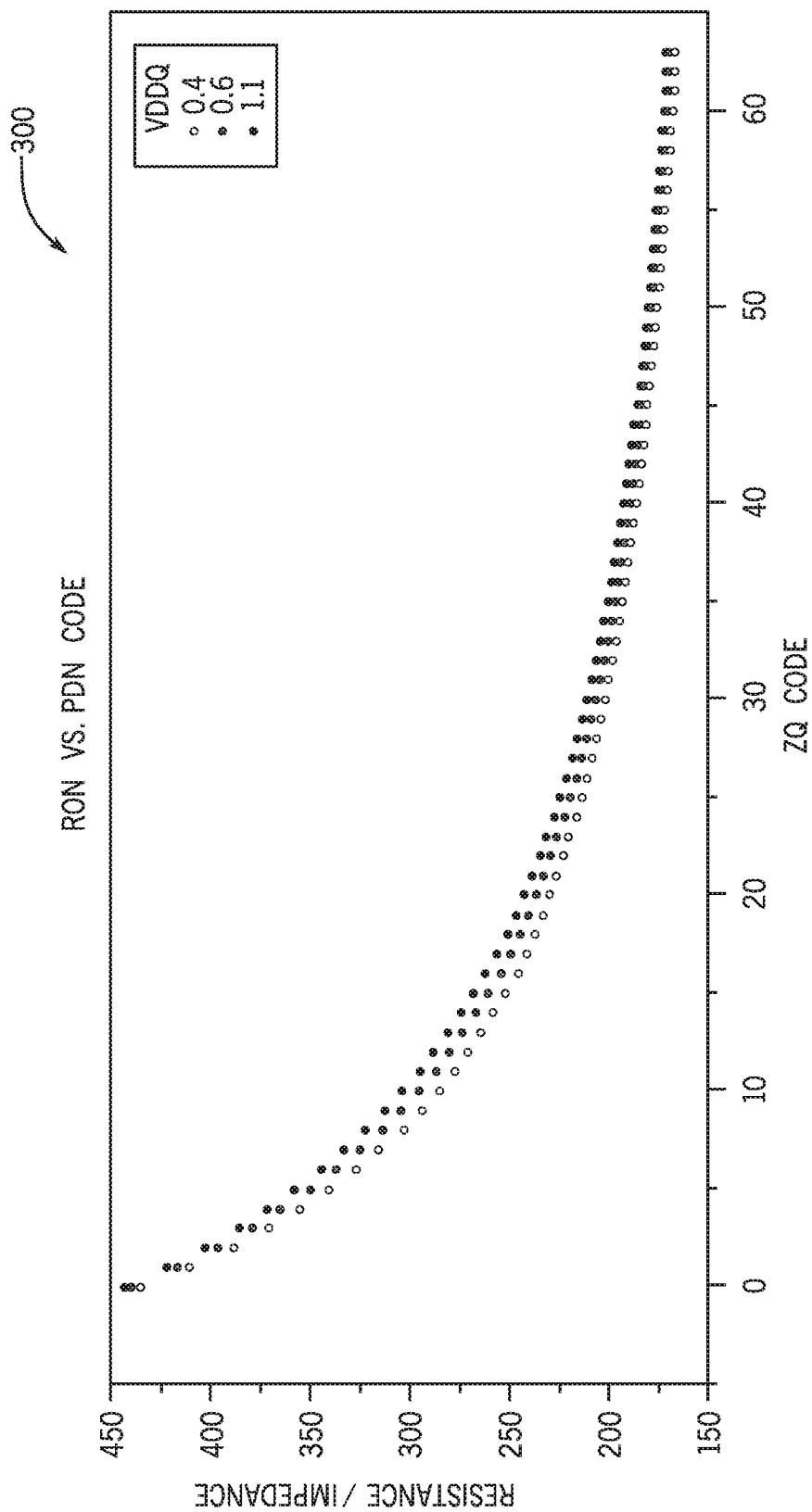
FIG. 3 depicts an exemplary impedance curve for a pull-down circuit of a driver over three different voltages as compared with an impedance code in accordance with an embodiment of the disclosure.

For example, FIG. 3 depicts an exemplary impedance curve 300 for a pull-down circuit of a driver over three different voltages as compared with a ZQCODE value in accordance with embodiments of the disclosure. As shown in FIG. 3, the impedance curve 300 flattens out as the ZQCODE gets larger. In the example of FIG. 3, an impedance (e.g., Resistance) value difference between the ZQCODE values 50 and 51 is less than an impedance value difference between the ZQCODE values 9 and 10. Therefore, a higher value ZQCODE would require a larger step to achieve the same impedance change in the driver as compared with a lower value ZQCODE. The dynamic adder/subtractor circuit may be configured to adjust increment and decrement step sizes based on a current value of the ZQCODE, in some examples.

Returning now to FIG. 2, a circuit diagram of a ZQ calibration circuit 275 in accordance with an embodiment of the present disclosure is depicted. For example, the chip 235 includes the ZQ calibration circuit 275 and a calibration terminal ZQ (e.g., ZQ pad) 236. In some examples, the ZQ calibration circuit 275 may include an arbiter circuit 280 that controls initiation of a calibration operation when multiple chips are coupled to the ZQ resistor RZQ 255.

The arbiter circuit 280 may be activated responsive to an activation of a chip (e.g., power on, etc.), by a ZQ Calibration command (e.g., a ZQ calibration start command), or both and may provide a pull-down (PDN) code signal when activated. The ZQ calibration circuit 275 may include a combination of a data terminal (DQ) pull-up (PUP) driver circuit 282 and a data terminal (DQ) pull-down (PDN) driver circuit 283 and a data terminal (DQ) pull-down (PDN) driver circuit 284 for arbitration as well as calibration. The DQ PUP driver circuit 282, DQ PDN driver circuit 283, and DQ PDN driver circuit 284 are replica circuits of a data terminal (DQ) pull-up (PUP) driver circuit, a data terminal (DQ) pull-down (PDN) driver circuit and a data terminal (DQ) pull-down (PDN) driver circuit attached to actual data terminals DQ. The DQ PDN driver circuit 284 may receive the PDN code signal from the arbiter circuit 280, and may pull down a ZQ pad voltage (VZQ) at the calibration terminal ZQ 236 responsive to the PDN code signal.

The ZQ pad voltage (VZQ) may be provided to a switch 285 (e.g., multiplexer Mux). The combination of the DQ PUP driver circuit 282 and the DQ PDN driver circuit 283 may execute adjustment of an intermediate ZQ voltage (iVZQ) at an intermediate node 288 between the combination of the DQ PUP driver circuit 282 and the DQ PDN driver circuit 283. For example, the DQ PUP driver circuit 282 may include a plurality of transistors coupled in parallel between a power supply terminal VDDQ and the intermediate node 288. The DQ PDN driver circuit 283 may include a plurality of transistors coupled in parallel between a power supply terminal VSSQ and the intermediate node 288. The intermediate ZQ voltage (iVZQ) may be provided to the switch 285. The switch 285 may provide either the ZQ pad voltage VZQ or the intermediate ZQ voltage iVZQ, depending on whether the ZQ calibration circuit 275 is executing arbitration or ZQ calibration, respectively. For example, the ZQ calibration circuit 275 may include a comparator 286.

The comparator 286 may compare the ZQ pad voltage VZQ or the intermediate ZQ voltage iVZQ provided by the switch 285 with a ZQ reference voltage ZQVREF or a ZQ arbitration reference voltage provided by a reference voltage generator 290. For example, the reference voltage generator 290 may be included in the ZQ calibration circuit 275, or the voltage generator 290 in FIG. 2 may provide the ZQ reference voltage ZQVREF and the ZQ arbitration reference voltage instead. For example, the comparator 286 may determine whether the ZQ pad voltage (VZQ) has been controlled by another requesting chip or the ZQ resistor RZQ 255 is currently in use.

The comparator 286 may provide a comparator result signal to the arbiter circuit 280 and a ZQ calibration code control circuit 281. For example, the arbiter circuit 280 may provide ZQ pad voltage control via the DQ PDN driver circuit 284 according to a ZQ timing pattern unique to the chip, having a fixed duration common to the plurality of chips. The arbiter circuit 280 may provide the PDN code until the ZQ pad voltage (VZQ) at the calibration terminal ZQ 236 matches the ZQ reference voltage ZQVREF. The ZQ timing pattern is unique for each chip, in order to determine whether the requesting chip should gain access to a ZQ resistor RZQ 255. The ZQ timing pattern may be programmed, or otherwise stored for each chip. For example, the arbiter circuit 280 for the chip 235 may include a register (not shown) for the chip 235 that may be programmed with the ZQ timing pattern information specific to the chip 235 for an assigned duration.

The ZQ calibration code control circuit 281 provides a PUP code and a PDN code to the DQ PUP driver circuit 282 and the DQ PDN driver circuit 283 respectively, responsive to the comparator result signal. In some examples, the PUP code and a PDN code are provided until the intermediate ZQ voltage iVZQ at the intermediate node 288 match the ZQ reference voltage ZQVREF. The PUP code and the PDN code may be included in the ZQCODE of FIG. 1. The ZQ calibration code control circuit 281 includes an adder/subtractor circuit 294 configured to adjust (e.g., increment or decrement) the PUP code and the PDN code based on the comparator result signal, by a dynamically adjustable initial first amount. The PUP code and the PDN codes set an impedance of the DQ PUP driver circuit 282 and the DQ PDN driver circuit 283, respectively, and adjusting the PUP code and the PDN codes adjust an impedance of the DQ PUP driver circuit 282 and the DQ PDN driver circuit 283, respectively.

In some examples, the impedance is adjusted by enabling or disabling transistors. For example, a first PUP code may enable a first set of transistors of the DQ PUP driver circuit 282, and increasing the PUP code by one may enable an additional transistor of the DQ PUP driver circuit 282, in addition to the first set of transistors. Conversely, decreasing the PUP code by one may disable one of the first set of transistors. Each time the PUP code or PDN code is adjusted, an impedance of the DQ PUP driver circuit 282 or the DQ PDN driver circuit 283, respectively, may be adjusted. A determination as to whether the PUP code or the PDN code are increased or decreased can be based on the comparison from the comparator 286. If the comparator 286 indicates that the voltage of the VZQ is higher than the ZQREF voltage, then the PUP or PDN code is adjusted in a first direction, and if the comparator 286 indicates that the voltage of the VZQ is lower than the ZQREF voltage, then the PUP or PDN code is adjusted in a second direction opposite the first direction.

In some examples, because of a design of the DQ PUP driver circuit 282 and the DQ PDN driver circuit 283, a change in impedance of the DQ PUP driver circuit 282 or the DQ PDN driver circuit 283 between consecutive PUP or PDN code values, respectively, may vary based on a current PUP or PDN code value. Generally, the higher the PUP or PDN code value, the less effect a same adjustment has on an impedance of the DQ PUP driver circuit 282 or the DQ PDN driver circuit 283, respectively as compared with a lower current code value. For example, when the PUP code has a low value, an increase of 1 affects the resulting impedance of the DQ PUP driver circuit 282 by more than an increase of 1 for a higher PUP code value.

In some examples, to mitigate this non-linear impedance as PUP and PDN code values increase, the adder/subtractor circuit 294 may dynamically change adjustment step size values for the PUP and PDN codes based on a current PUP or PDN code value. For example, a higher PUP or PDN code value may have a larger step size than a lower PUP or PDN code value. In some examples, the adder/subtractor circuit 294 may have a minimum adjustment step size of one, and may use a subset (e.g., two or more) of the most significant bits (MSBs) of the PDN or PUP code value to as the adjustment step size. For example, if the adder/subtractor circuit 294 provides a 6-bit PDN or PUP code value, the adjustment step size may be based on a value of the three MSBs of the current PDN or PUP code value. By dynamically adjusting the adjustment step sizes of the PDN or PUP code values by the adder/subtractor circuit 294 during a calibration operation, the time to complete the calibration may be reduced when PUP and PDN code values are higher (e.g., because of the reduced effect on changes in impedance of the DQ PUP driver circuit 282 and the DQ PDN driver circuit 283), and the adjustments may result in a more uniform change in impedance value.

Figure 2:
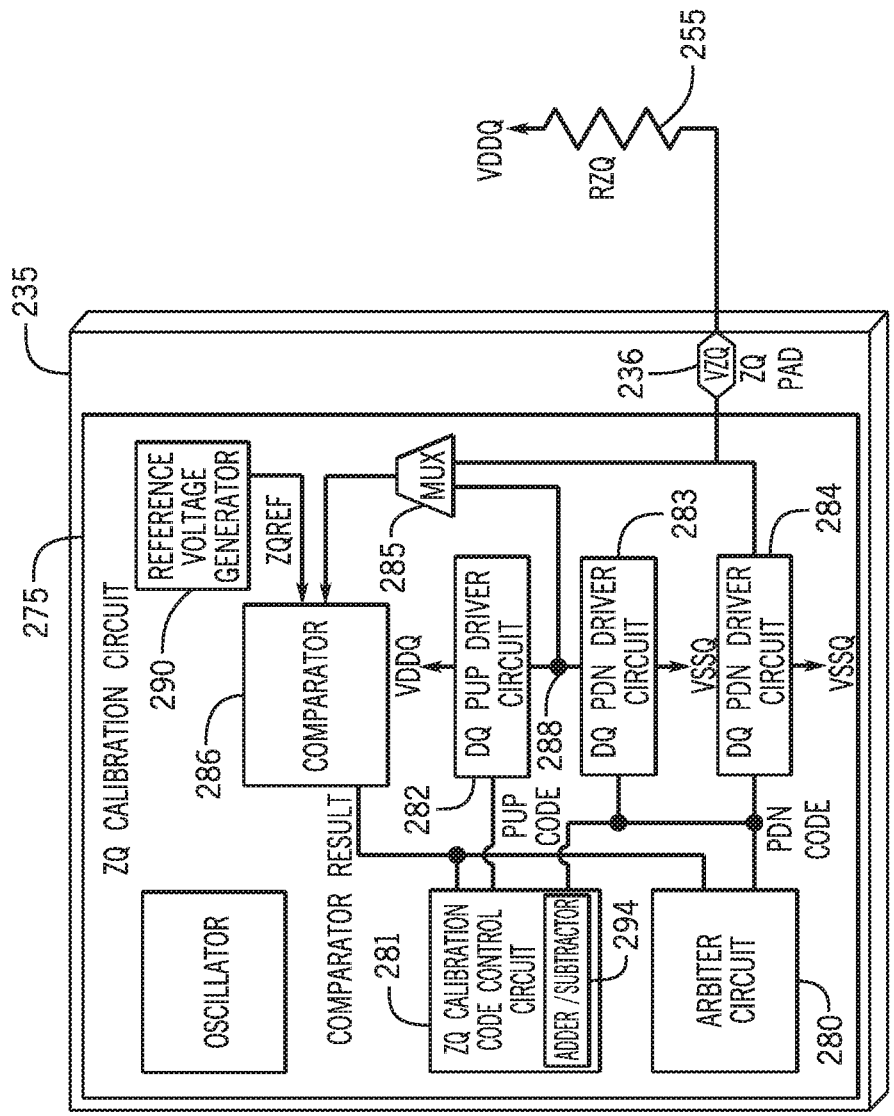
FIG. 2 is a schematic block diagram of a ZQ calibration circuit in accordance with an embodiment of the present disclosure.

The discussion for FIG. 2 describes performing calibration with adjusted step sizes for the PUP and PDN codes when the RZQ is coupled between VDDQ and the ZQ Pad 236, and includes calibrating the DQ PDN driver circuit 284 first, and then using that calibrated PDN code to set the DQ PDN Driver Circuit 283 for calibration of the DQ PUP driver circuit 282. It will be appreciated that calibration with adjusted step sizes for the PUP and PDN codes when the RZQ is coupled between VSSQ and the ZQ Pad 236 may be performed in a similar manner without departing from the scope of the disclosure, including calibration of the DQ PUP driver circuit 282 first, which would be coupled to the ZQ Pad, and then using that resulting PUP code to set an impedance of a second DQ PUP driver circuit in order to calibrate the DQ PDN driver circuit 283.

i. Calibration Via Dynamic Step Size Partial Binary Search

In some embodiments, a partial binary search that only covers a portion of the searchable ZQ calibration codes may be used to find a ZQCODE within an acceptable margin of error. The partial binary search may provide many benefits over a full binary search that searches the entire range of ZQ calibration codes. For example, the number of search comparisons may be reduced, enabling more search time for each of the binary search steps. This increased time allotment may result in better noise immunity among other benefits.

Further, because of the non-linearity between the resistance changes and the ZQCODE changes, additional efficiencies may be introduced. In certain partial binary search embodiments, the initial step size for the binary search may vary based upon the initial ZQCODE. For example, as illustrated in FIG. 3, at lower ZQCODEs, the resistance changes more than higher ZQCODEs, when there is a stepped variation to the ZQCODE. Accordingly, a direct relationship between a varied initial step size and the initial ZQCODE may be used. In other words, the initial binary search step size may increase with increased initial ZQCODEs.

Figure 4:
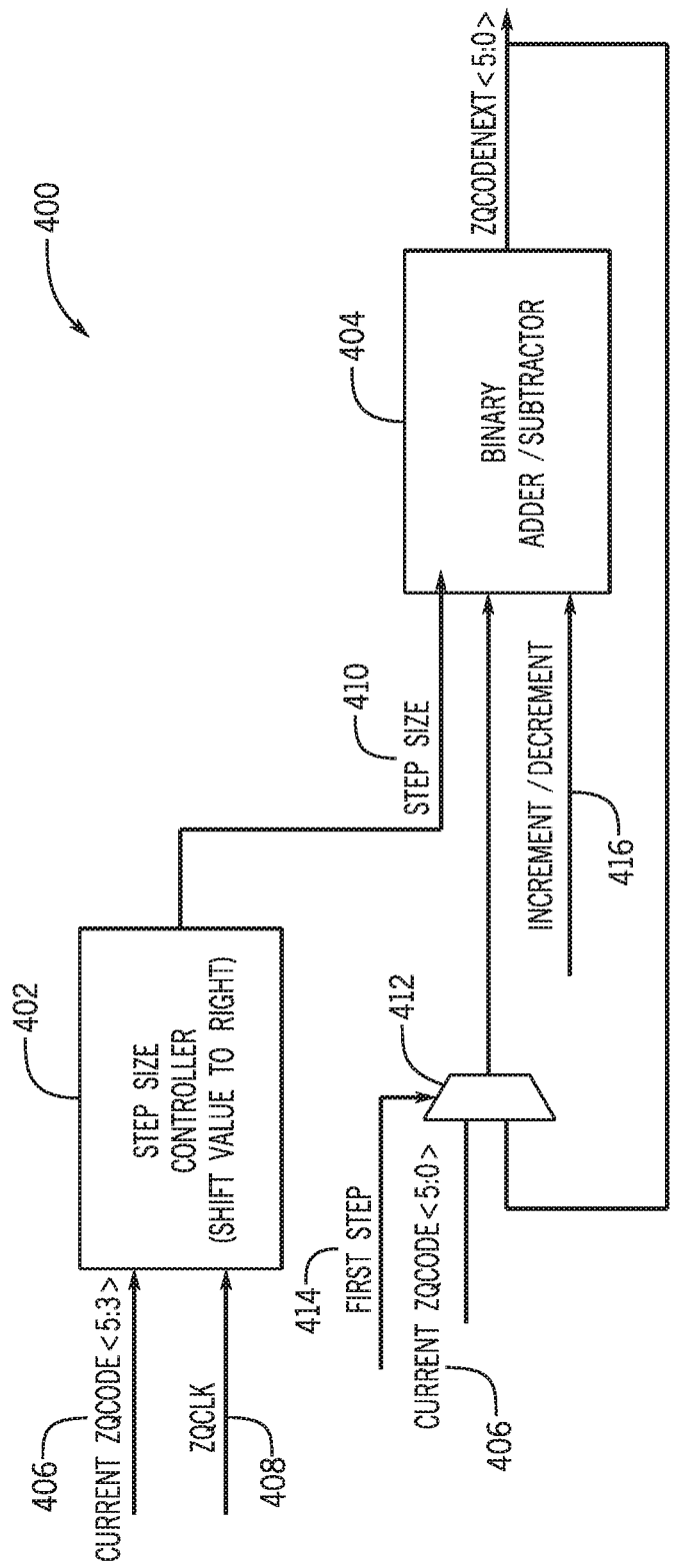
FIG. 4 is a circuit diagram of a ZQ calibration code control circuit including an adder/subtractor circuit and a step size controller circuit, in accordance with an embodiment of the present disclosure.

FIG. 4 is a circuit diagram of a ZQ calibration code control circuit (ZQ calibration circuitry) 400 with non-linearity compensation circuitry that can compensate for the non-linear relationship between changes in ZQCODEs and associated changes in resistance/impedance. For example, the ZQ calibration circuitry 400 may include an adder/subtractor circuit and a step size controller circuit, in accordance with an embodiment of the present disclosure. As illustrated, the ZQ calibration circuitry 400 includes a step size controller circuit 402 and a binary adder/substractor circuit 404. The step size controller circuit 402 controls the step size for the binary search based upon of the current ZQCODE 406, using a clock 408 (ZQClk). As illustrated, in some embodiments, a set of the most significant bits (MSBs) (e.g., <5:3>, <5:2>, etc.) of the current ZQCODE 406 may be sufficient to determine a range of the ZQCODE 406 for selection of an initial step size for a binary search. For example, it can be discerned whether the current ZQCODE 406 (N) falls within one of the ranges 602 depicted in the step selection table 600 of FIG. 6 (discussed in greater detail below), using bits <5:2> of N. For example, it can be discerned whether:

N>=32;
12<=N<32;
8<=N<12; or
N<8

Figure 6:
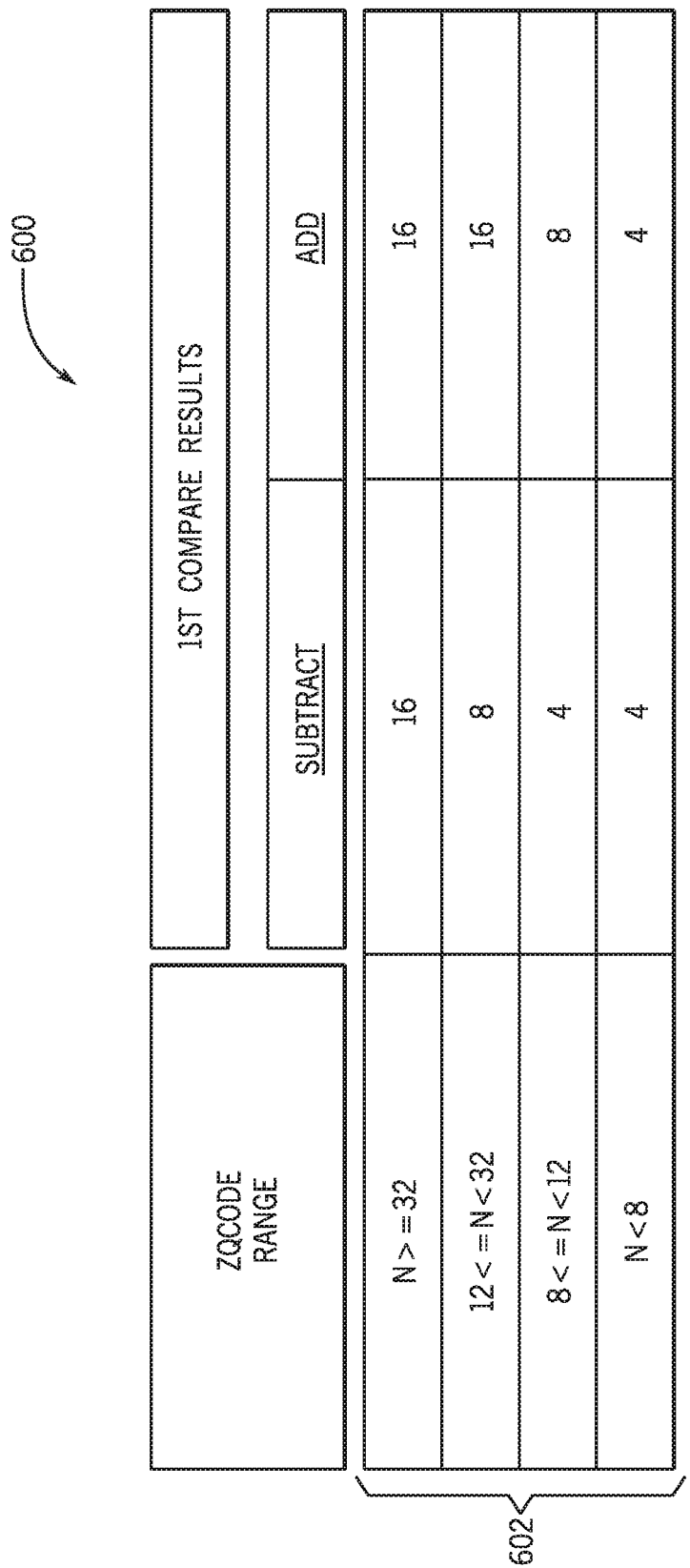
FIG. 6 is a table, illustrating starting step sizes based upon ZQCODE ranges, in accordance with an embodiment of the present disclosure.

Alternatively, bits <5:2> could be used to discern whether:

N>=32;
16<=N<32;
8<=N<16; or
N<9, as depicted in the ranges of FIG. 6.

Based upon the values of the ZQCODE 406 provided to the step size controller 402, a step size 410 is identified and provided to the binary adder/substractor 404. A multiplexor 412 selects a ZQCODE to provide to the binary adder/substractor 404 based upon a first step indication selector signal 414. For example, when the first step indication selector signal 414 indicates that a first step in ZQ calibration is occurring, all bits (e.g., 6 bits) of the Current ZQCODE 406 may be provided to the binary adder/substractor 404, enabling modification via addition to or subtraction to the current ZQCODE 406, depending on an indication provided by the increment/decrement signal 416. However, when the first step indication selector signal 414 indicates that that the first step of the ZQ calibration is not occurring (e.g., a subsequent ZQ calibration step is occurring), all bits (e.g., 6 bits) of a modified output from the binary adder/substractor 404 (e.g., the ZQCODENext) are selected and provided by the multiplexor 412 to the binary adder/subtractor for additional modification. Further, in such a case, the previous step size used (e.g., the initial step size 410 in the first step) is halved, to continue the binary search. For example, if the initial step size is 16 on the first step of the ZQ calibration, the step size for the second step of the ZQ calibration is 8, and so on.

Figure 5:
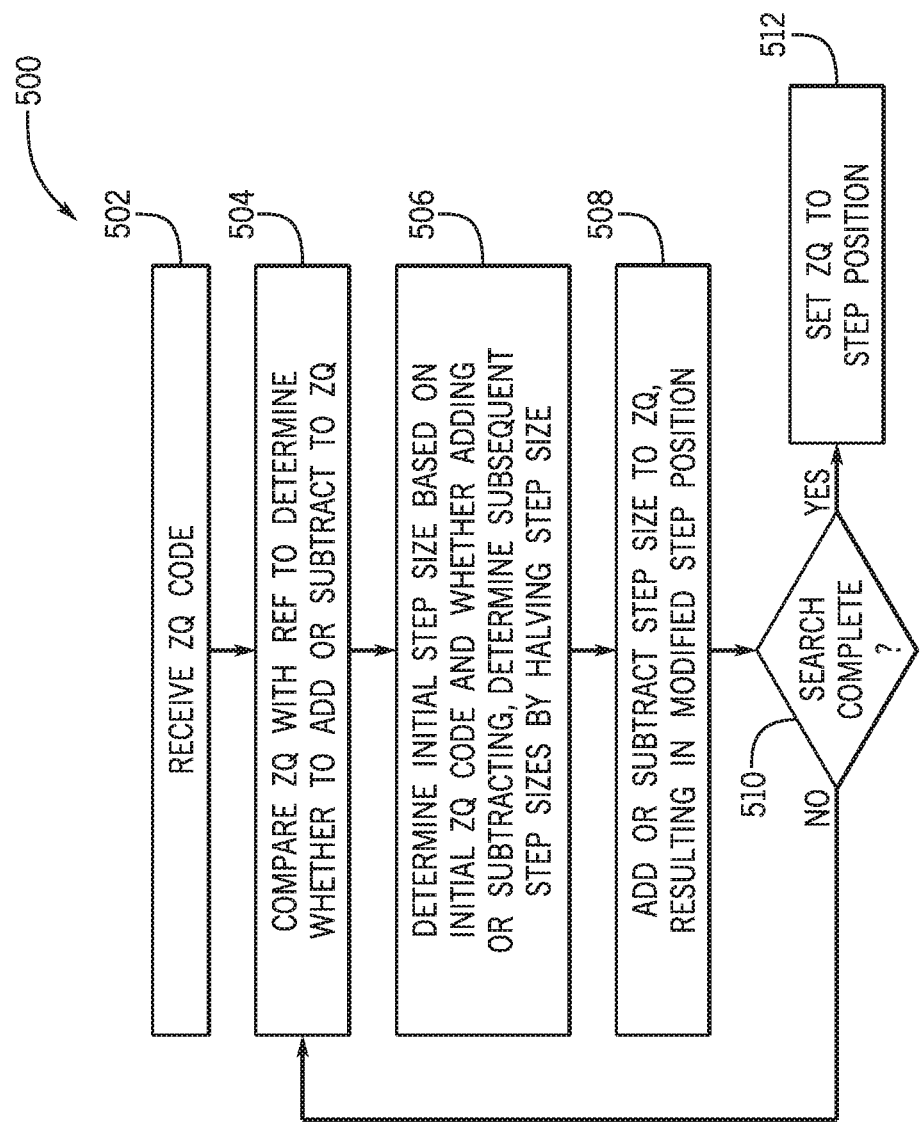
FIG. 5 is a flowchart, illustrating a process for performing ZQ calibration using a changing step size binary search, in accordance with an embodiment of the present disclosure.

Continuing with a more-detailed discussion of the partial binary search used for ZQ calibration, FIG. 5 is a flowchart, illustrating a process 500 for performing ZQ calibration using a changing step size binary search, in accordance with an embodiment of the present disclosure. As mentioned above, the current ZQCODE is used to determine an initial step size for a binary search. Accordingly, the process 500 begins by receiving an indication of the current ZQCODE (block 502). As illustrated in FIG. 4, this may be received in the form of a bit stream (e.g., bits 5:0).

Next, the current ZQ voltage (the voltage associated with the current ZQCODE) is compared with an external reference voltage to determine whether the ZQCODE should be incremented or decremented (block 504). When the ZQ voltage is greater than the reference voltage, addition will occur. Further, when the ZQ voltage is less than the reference voltage, subtraction will occur. In the case where the ZQ voltage is equal to the reference voltage, no further calibration is needed and the binary search can be aborted. An indication (e.g., a decrement signal (DEC)) may be provided, indicating the results of this determination.

The initial step size is determined based upon the received current ZQCODE (block 506) and the determination of addition or subtraction to the ZQCODE. For instance, the step size may be retrieved from a lookup table, by performing a bit shift on most significant bits (MSBs) of the ZQCODE, etc. FIG. 6 illustrates one example table 600 of initial step sizes for particular ranges of ZQCODEs. As illustrated in FIG. 6, the selected initial step size is determined based upon the current ZQCODE. For example, in accordance with the example of FIG. 6, when the ZQCODE is greater than or equal to 32, the initial step size is 16 for both addition and subtraction. When the ZQCODE is greater than or equal to 12 and less than 32, the initial step size is 8 for subtraction and 16 for addition. When the ZQCODE is greater than or equal to 8 and less than 12, the initial step size is 4 for subtraction and 8 for addition. When the ZQCODE is less than 8, the initial step size is 4 for both addition and subtraction. Other ranges and initial step sizes can be used. The effects of changing the ranges and step sizes will be discussed in more detail below with regard to FIGS. 9-11. Subsequent step sizes are determined by halving previous step sizes.

Returning to the process 500 of FIG. 5, a dynamic binary search may be implemented using the step sizes determined in block 506 (e.g., the initial step size and subsequent step sizes). To complete the search, in a first iteration, the initial step size is added or subtracted to the ZQCODE, resulting in a modified step position for the ZQCODE (block 508). In other words, the ZQCODE is now modified by the initial step size determined in block 506. In subsequent iterations of blocks 504-510, the subsequent step size is used to modify previously modified ZQCODEs, as will become apparent.

For instance, at decision block 510, it is determined whether the search is completed. For example, the binary search may include a particular number of ZQ voltage to reference voltage comparisons (e.g., a threshold number of comparisons). The search is completed when the particular number of comparisons are made. In one embodiment, four comparisons may be sufficient to traverse enough of the range of ZQCODEs to fall within a sufficient error range. This will be discussed in more detail below with regard to FIGS. 9-11. Fewer or more comparisons may be made in other embodiments.

If the proper number of comparisons has been made, the search is complete and the ZQCODE is set to the current step position (e.g., the last ZQCODE modified by a step size in block 508) and the ZQ calibration concludes (block 512). However, when the proper number of comparisons has not been made, the search is not complete and blocks 504-510 are iteratively repeated until it is determined that the search is complete in decision block 510. The subsequent iterations use the last modified ZQCODE of block 508 and subsequent step sizes that are half the previous step size determined in block 506.

Figure 7:
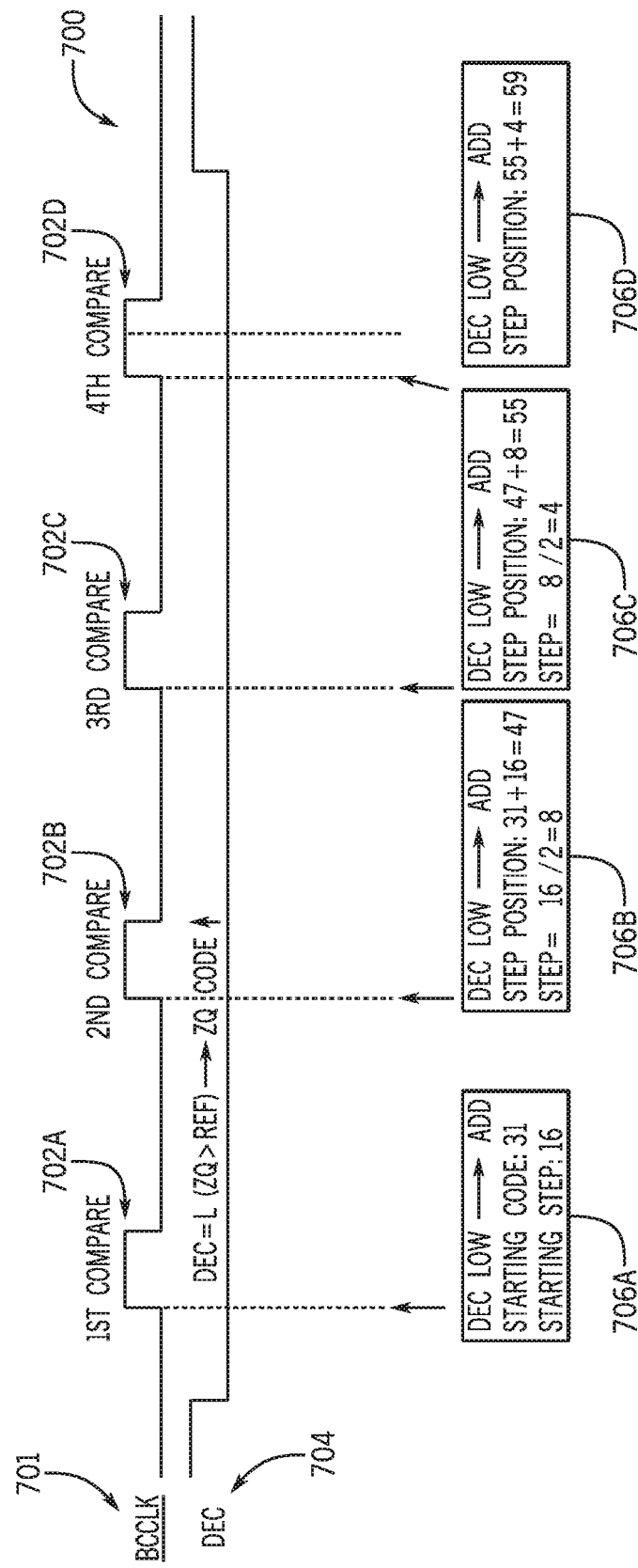
FIG. 7 provides a specific additive example using an example ZQCODE, in accordance with an embodiment.

FIG. 7 provides a specific additive timing diagram 700 example using an example initial ZQCODE of 31, in accordance with an embodiment. ZQCODE 31 is provided merely as an example, as it falls within a middle range of ZQCODEs. Continuing with the 4 comparison binary search embodiment discussed above, the timing diagram includes 4 compares at clock 701 (BCClk) toggle periods 702A, 702B, 702C, and 702D. In the first compare, the DEC signal 704, which indicates whether to decrement (subtract from) or increment (add to) the ZQCODE, is LOW. This LOW DEC signal 704 indicates that the ZQCODE should be incremented. As mentioned above, in this example the initial ZQCODE is 31. Because the voltage associated with ZQCODE 31 is greater than the reference voltage, addition to the ZQCODE will occur. Referring back to table 600 of FIG. 6, because the ZQCODE falls within the range 12<=N<32 and the ZQCODE will be added to, the initial step size is set to 16. These determinations are illustrated in box 706A.

During the second compare at toggle period 702B, a comparison of the ZQ voltage with the reference voltage continues to show that addition to the ZQCODE should occur (as indicated by the DEC signal 704 at toggle period 702B). The ZQCODE is modified to equal itself plus the initial starting step size of 16. Accordingly, the modified ZQCODE is set to 47. The subsequent step size is then determined by halving the previously used step size, resulting in a subsequent step size of 8. These determinations are illustrated in box 706B.

During the third compare at toggle period 702C, a comparison of the ZQ voltage with the reference voltage continues to show that addition to the ZQCODE should occur (as indicated by the DEC signal 704 at toggle period 702C). The ZQCODE is modified to equal itself plus the previously determined subsequent step size of 8. Accordingly, the modified ZQCODE is set to 55. The subsequent step size is then determined by halving the previously used step size, resulting in a subsequent step size of 4. These determinations are illustrated in box 706C.

During the fourth and final compare at toggle period 702D, a comparison of the ZQ voltage with the reference voltage continues to show that addition to the ZQCODE should occur (as indicated by the DEC signal 704 at toggle period 702D). The ZQCODE is modified to equal itself plus the previously determined subsequent step size of 4. Accordingly, the modified ZQCODE is set to 59. At this point, the binary search completes and the calibrated ZQCODE is set to 59, as illustrated in box 706D.

Figure 8:
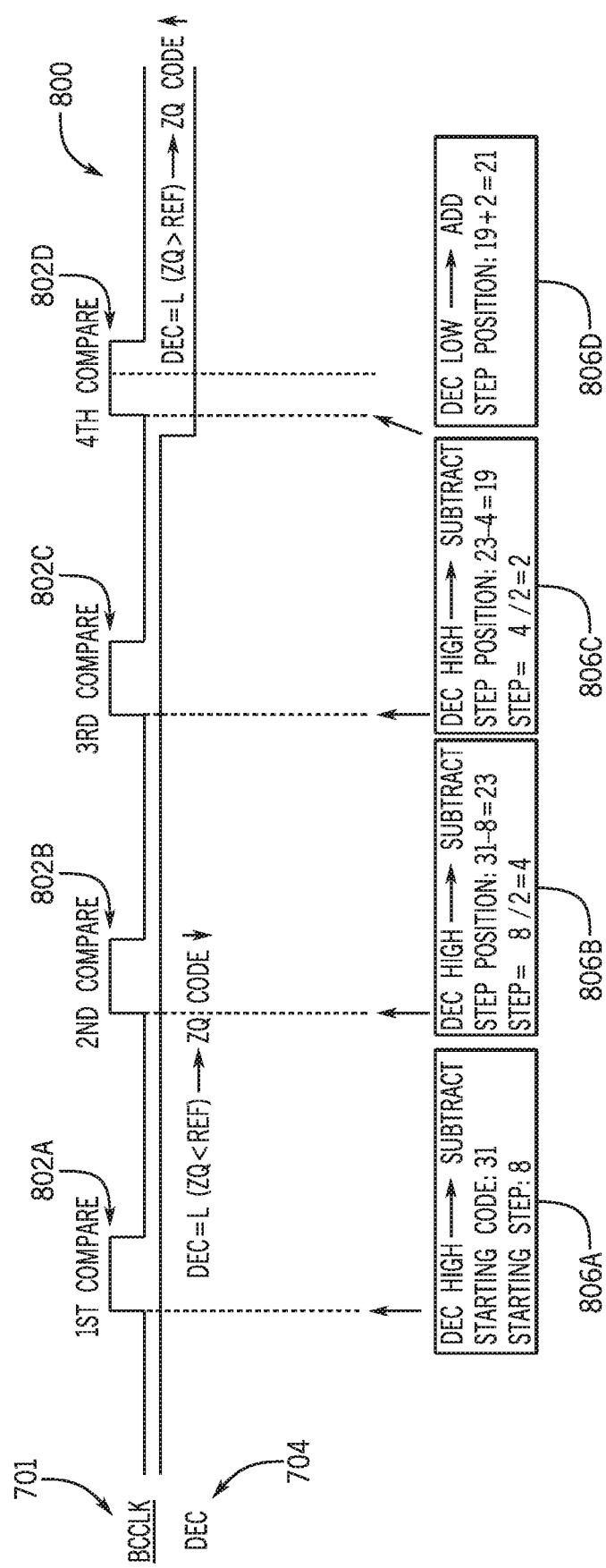
FIG. 8 provides a specific subtractive example using an example ZQCODE, in accordance with an embodiment.

Turning now to an additional example, FIG. 8 provides a specific subtractive timing diagram 800 example using an example ZQCODE of 31, in accordance with an embodiment. Once again, ZQCODE 31 is provided merely as an example, as it falls within a middle range of ZQCODEs. Continuing with our 4 comparison binary search embodiment discussed above, the timing diagram includes 4 compares at clock 701 (BCClk) toggle periods 802A, 802B, 802C, and 802D. In the first compare, the DEC signal 704, which indicates whether to decrement (subtract from) or increment (add to) the ZQCODE, is HIGH. This HIGH DEC signal 704 indicates that the ZQCODE should be decremented. As mentioned above, in this example the initial ZQCODE is 31. Because the voltage associated with ZQCODE 31 is less than the reference voltage, subtraction to the ZQCODE will occur. Referring back to table 600 of FIG. 6, because the ZQCODE falls within the range 12<=N<32 and the ZQCODE will be subtracted from, the initial step size is set to 8. These determinations are illustrated in box 806A.

During the second compare at toggle period 802B, a comparison of the ZQ voltage with the reference voltage continues to show that subtraction from the ZQCODE should occur (as indicated by the DEC signal 704 at toggle period 802B). The ZQCODE is modified to equal itself minus the initial starting step size of 8. Accordingly, the modified ZQCODE is set to 23. The subsequent step size is then determined by halving the previously used step size, resulting in a subsequent step size of 4. These determinations are illustrated in box 806B.

During the third compare at toggle period 802C, a comparison of the ZQ voltage with the reference voltage continues to show that subtraction from the ZQCODE should occur (as indicated by the DEC signal 704 at toggle period 802C). The ZQCODE is modified to equal itself minus the previously determined subsequent step size of 4. Accordingly, the modified ZQCODE is set to 19. The subsequent step size is then determined by halving the previously used step size, resulting in a subsequent step size of 2. These determinations are illustrated in box 806C.

In some cases, one or more of the step adjustments may over-adjust. In such situations, the binary search may reverse from decrementing to incrementing or vice versa. For example, during the fourth and final compare of the current example, at toggle period 802D, a comparison of the ZQ voltage with the reference voltage shows that addition to the ZQCODE should occur (as indicated by the DEC signal 704 at toggle period 802D). The ZQCODE is modified to equal itself plus the previously determined subsequent step size of 2. Accordingly, the modified ZQCODE is set to 21. At this point, the binary search completes and the calibrated ZQCODE is set to 21, as illustrated in box 806D.

Using the provided binary search technique for calibrating ZQ may result in improved calibration over traditional calibration techniques. Fewer calibration comparisons may be implemented to reach a ZQCODE within a satisfactory margin of error. This may result in faster calibration that requires less processing time and/or power.

Figure 9:
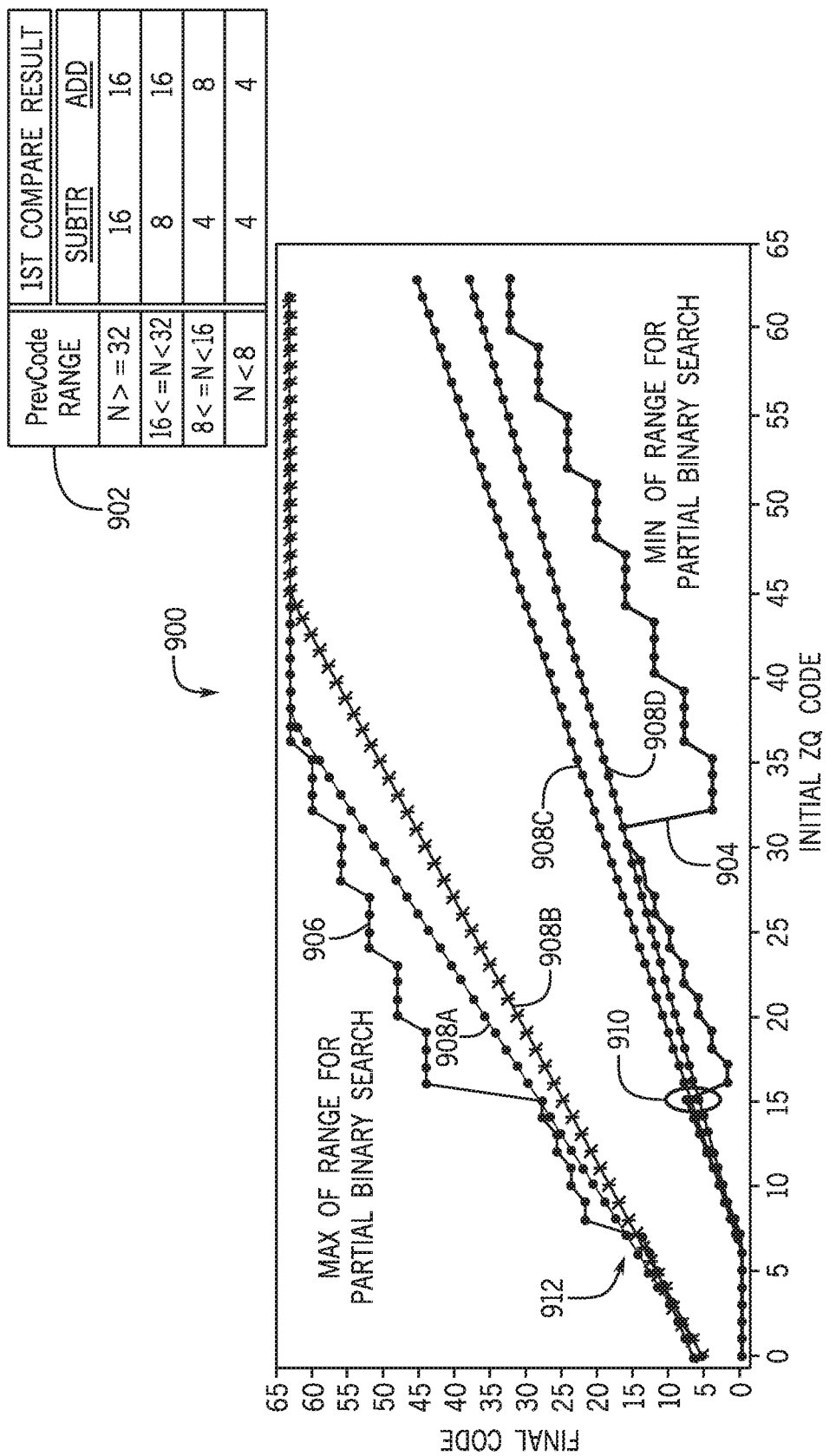
FIGS. 9-11 illustrate range results for ZQ calibration using different range values for starting steps, in accordance with certain embodiments.
Figure 10:
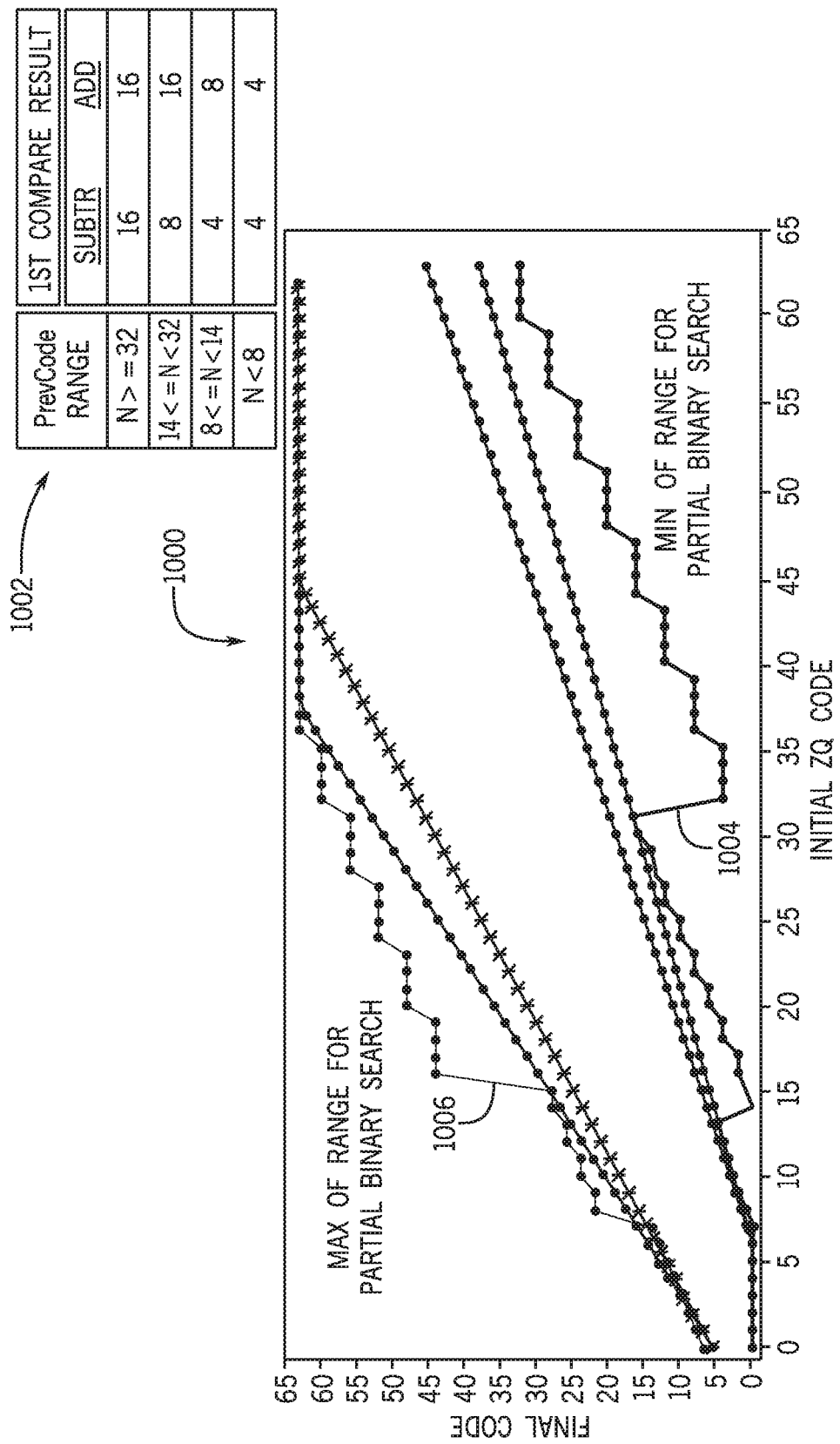
Figure 11:
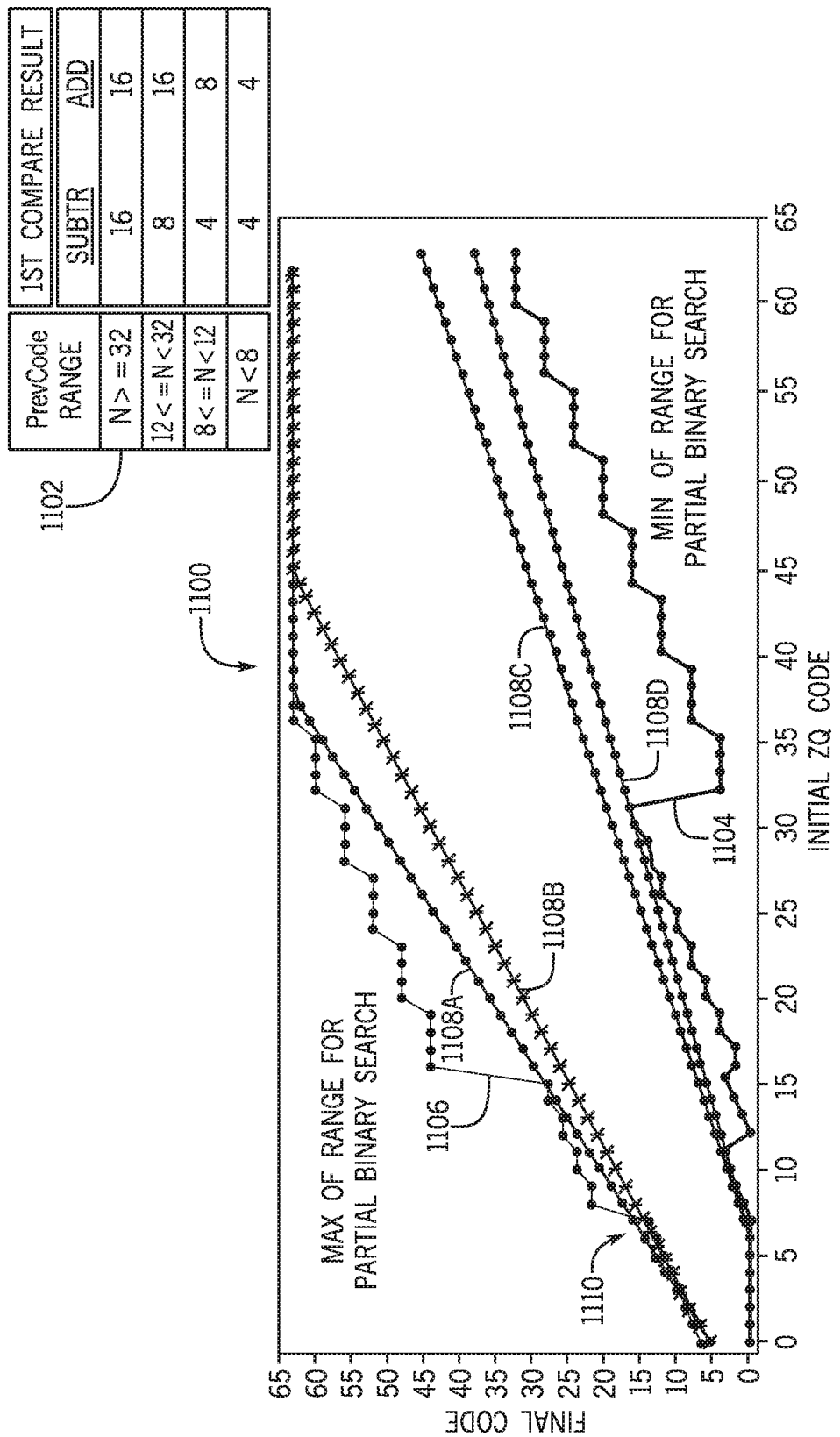

Turning now to a discussion of the variations to the ZQCODE range breakpoints that are used to identify the initial step size, FIGS. 9-11 illustrate range breakpoint results for actual ZQ calibrations using different range breakpoint values, in accordance with certain embodiments. Starting first with FIG. 9, the chart 900 illustrates an embodiment using range breakpoints 902. A first set of range breakpoints include: N>=32; 16<=N<32; 8<=N<16; and N<8, where N is the initial ZQCODE. The x-axis of the chart 900 represents the initial ZQCODE (N) values. The y-axis represents the final ZQCODE after the ZQ calibration process. Line plot 904 represents the minimum range for the final ZQCODE at a particular initial ZQCODEs that can be achieved by the binary search discussed above. Line plot 906 represents the maximum range for the final ZQCODE at a particular initial ZQCODEs that can be achieved by the binary search discussed above. Line plots 908A, 908B, 908C, and 908D each illustrate actual variations observed from initial ZQCODEs to final ZQCODEs. The area between the minimum range (line plot 904) and the maximum range (line plot 906) can be handled by the current range breakpoints 902. In areas which cross outside the minimum and/or maximum ranges, there may be some minor error, as the calibration may not reach the final ZQCODE. As illustrated, with the current range breakpoints 902, there is a tight margin around initial ZQCODE 15, as indicated by circle 910. Further, there are areas of line plot 908A that extend beyond the maximum range (e.g., at location 912). Correction of tight margins around the minimum range may be prioritized over breaches of the maximum range, as the amount of resistance changes more at the lower ZQCODEs as compared to the higher ZQCODEs (as depicted in FIG. 3). Thus, it may be desirable to modify the range breakpoints in chart 900 to provide better margins at the minimum and/or maximum ranges.

FIG. 10 illustrates a results chart for an embodiment with modified range breakpoints 1002. The range breakpoints 1002 are altered to N>=32; 14<=N<32; 8<=N<14; and N<8. Looking at the chart 1000, it is clearly visible that the margin at ZQCODE is now much larger, providing more range coverage than the previous embodiment of FIG. 9. For example, the line plot 1004 is shifted downward at the initial ZQCODE 15, as compared to the previous embodiment of FIG. 9. There is very little change to maximum range, as indicated by line plot 1006.

In FIG. 11, the chart 1100 illustrates an embodiment using another set of range breakpoints 1102. The range breakpoints include: N>=32; 12<=N<32; 8<=N<12; and N<8. As illustrated, most of the line plots 1108A, 1108B, 1108C, and 1108D are in between the minimum range (line plot 1104) and the maximum range (line plot 1106), meaning that these variations from the initial ZQCODE to the final ZQCODE can be handled by the current embodiment. In areas which cross outside the minimum and/or maximum ranges, there may be some error, as the calibration may not reach the final ZQCODE. However, as depicted, there are very few areas where this occurs (e.g., at area 1110). Further, this error is primarily on the maximum range size, which will likely result in relatively little resistance value error, as the steps at the higher ZQCODES have relatively smaller resistance changes.

ii. Calibration Via Calibration Code Converted Search

In some embodiments, the non-linear relationship between the resistance variation and the ZQCODE variation may be accounted for by converting, via non-linearity compensation circuitry, the initial ZQCODEs (e.g., binary search results) to a converted ZQCODE that is adjusted to compensate for this non-linearity. In other words, the amount of change in the converted ZQCODE may increase as the resistance changes for changing the initial ZQCODE decrease. Referring back to FIG. 3, the amount of change in a converted ZQCODE for initial ZQCODE 15 would be far less than a converted ZQCODE for initial ZQCODE 50, because the resistance changes near ZQCODE 15 are far greater than the resistance changes near ZQCODE 50. The smaller change in ZQCODE conversion for the smaller ZQCODEs, in essence, creates small changes when resistance variations may be great and larger changes when resistance variations may be small. In other words, the conversion creates a linear relationship between the binary code and the DQ driver resistance. This conversion acts as a catalyst in the search for a proper ZQCODE, resulting in reduced search steps, enabling more time at each search step (e.g., from 6 steps to 5 steps with low power double data rate (DDR4) (LP4) and low power DDR5 (LP5 and from 5 steps to 4 steps with DDR4 and DDR5)). As mentioned above, this may enable greater noise immunity.

Figure 12:
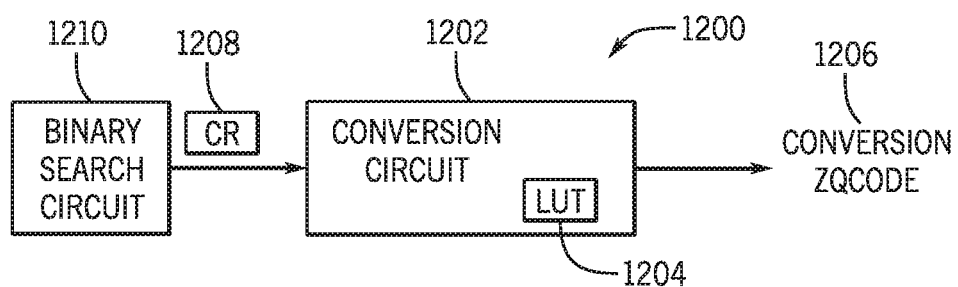
FIG. 12 is a schematic block diagram of a ZQ calibration code control circuit including an adder/subtractor circuit and a converter circuit, in accordance with an embodiment of the present disclosure.
Figure 13:
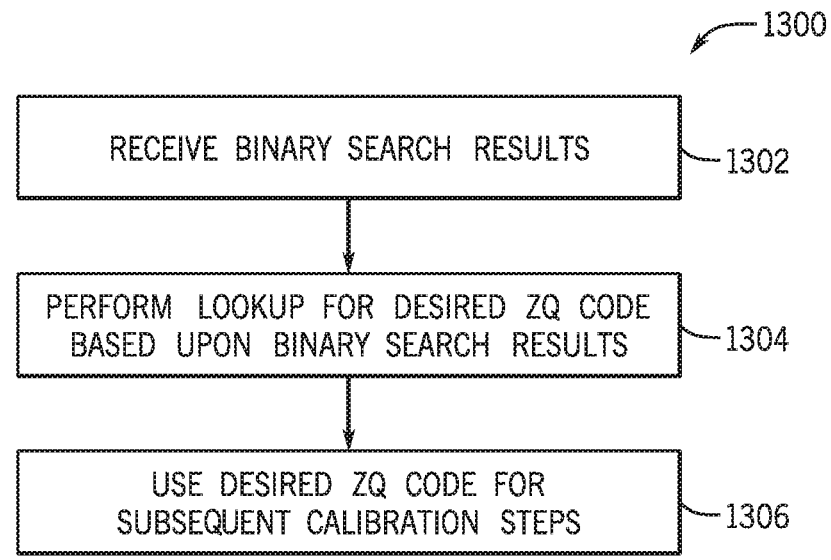
FIG. 13 is a flowchart, illustrating a process for ZQ calibration, using the ZQ calibration code control circuit of FIG. 12, in accordance with an embodiment of the present disclosure.

Turning now to an embodiment of non-linearity compensation circuitry that can implement the ZQCODE conversion for this search, FIG. 12 is a block diagram of ZQ calibration circuitry 1200. FIG. 13 is a flowchart, illustrating a process 1300 for ZQ calibration, using the ZQ calibration circuitry

1200 of FIG. 12, in accordance with an embodiment of the present disclosure. For simplicity, FIGS. 12 and 13 will be discussed together.

The process 1300 begins by receiving binary search results (block 1302). For example, as illustrated in FIG. 12, the ZQ calibration circuitry 1200 includes a binary search circuit 1210 that performs a binary search for a code output that matches a reference resistance, as discussed above. As illustrated, the conversion circuit 1202 receives an initial code result 1208 from the binary search circuit 1210.

Next, the process 1300 proceeds to perform a lookup for a desired ZQCODE based upon the binary search results (block 1304). For example, as illustrated in FIG. 12, the conversion circuit 1202 utilizes a lookup table (LUT) 1204 to derive a conversion ZQCODE 1206, in accordance with an embodiment of the present disclosure. The conversion circuit 1202 may use the LUT 1204 to identify a conversion ZQCODE 1206 based upon the code result 1208. The LUT 1204 stores conversion ZQCODEs that provide equal resistance steps between the binary search code results 1208, creating a linear relationship between the binary search code results 1208 and the DQ driver resistance variations. For example, as mentioned above, for a relatively low code result 1208, there will be relatively little change in value for the converted ZQCODE 1206. However, for a relatively high code result 1208, a relatively high change in the converted ZQCODE 1206 may be observed.

The converted ZQCODE 1206 may be used for subsequent calibration steps (block 1306). For example, if additional binary searching steps are required, the desired ZQCODE may be used for the comparison with the ZQ reference value. Upon each of the search steps being completed, the final conversion ZQCODE 1206 may be the final ZQCODE used for calibration.

Figure 14:
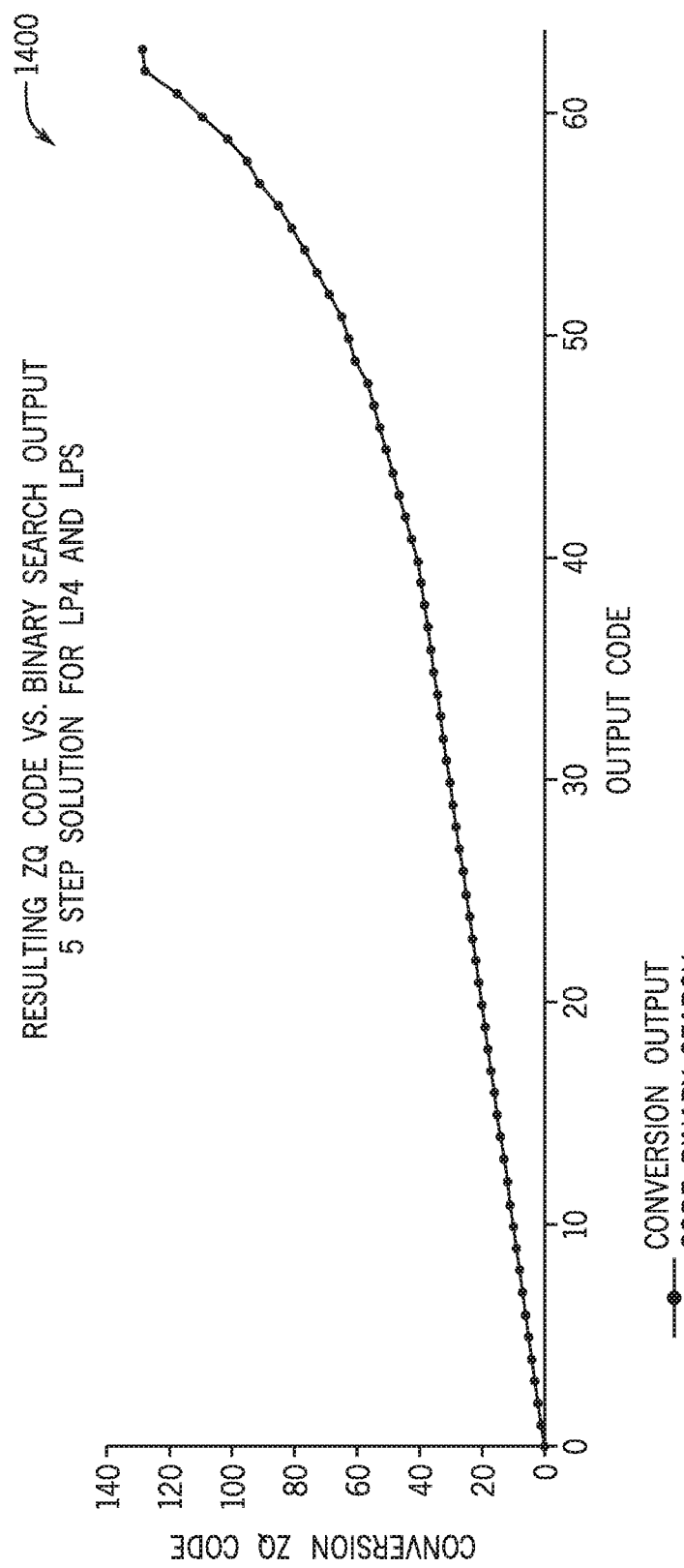
FIG. 14 depicts ZQCODE inputs and their converted ZQCODEs for a 5 compare solution, in accordance with an embodiment of the present disclosure.
Figure 15:
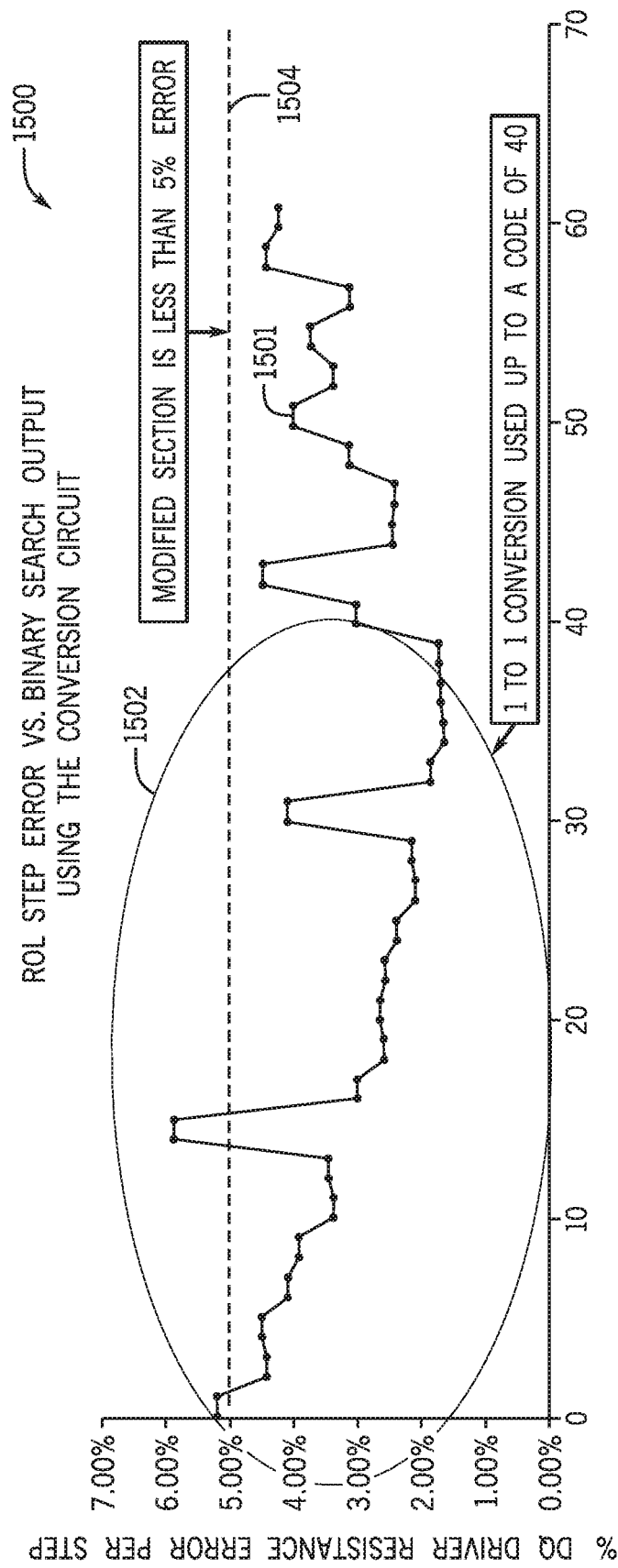
FIG. 15 is data plot diagram illustrating a resistance error per step versus binary search output, in accordance with an embodiment of the present disclosure.
Figure 16:
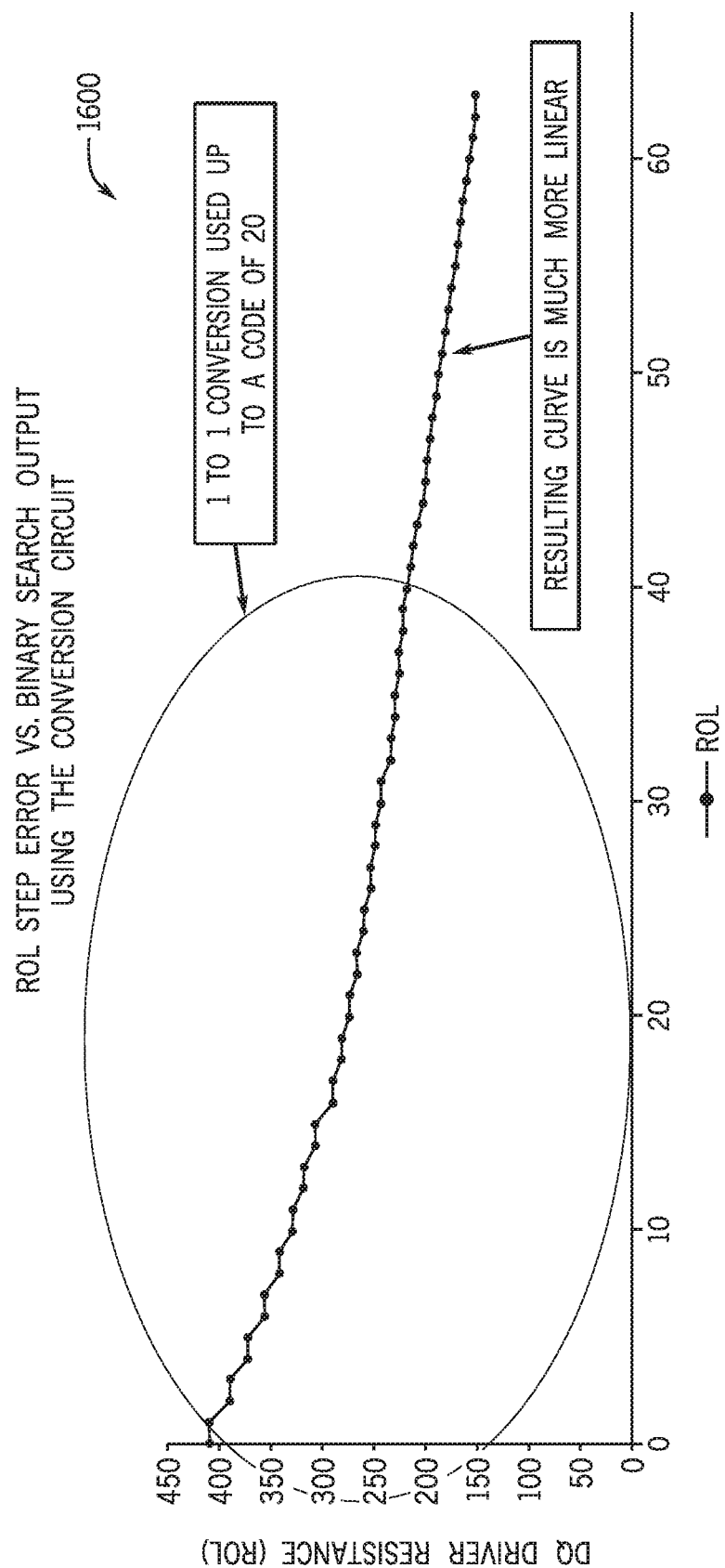
FIG. 16 is a data plot diagram illustrating driver resistance versus binary search output, in accordance with an embodiment of the present disclosure.
Figure 17:
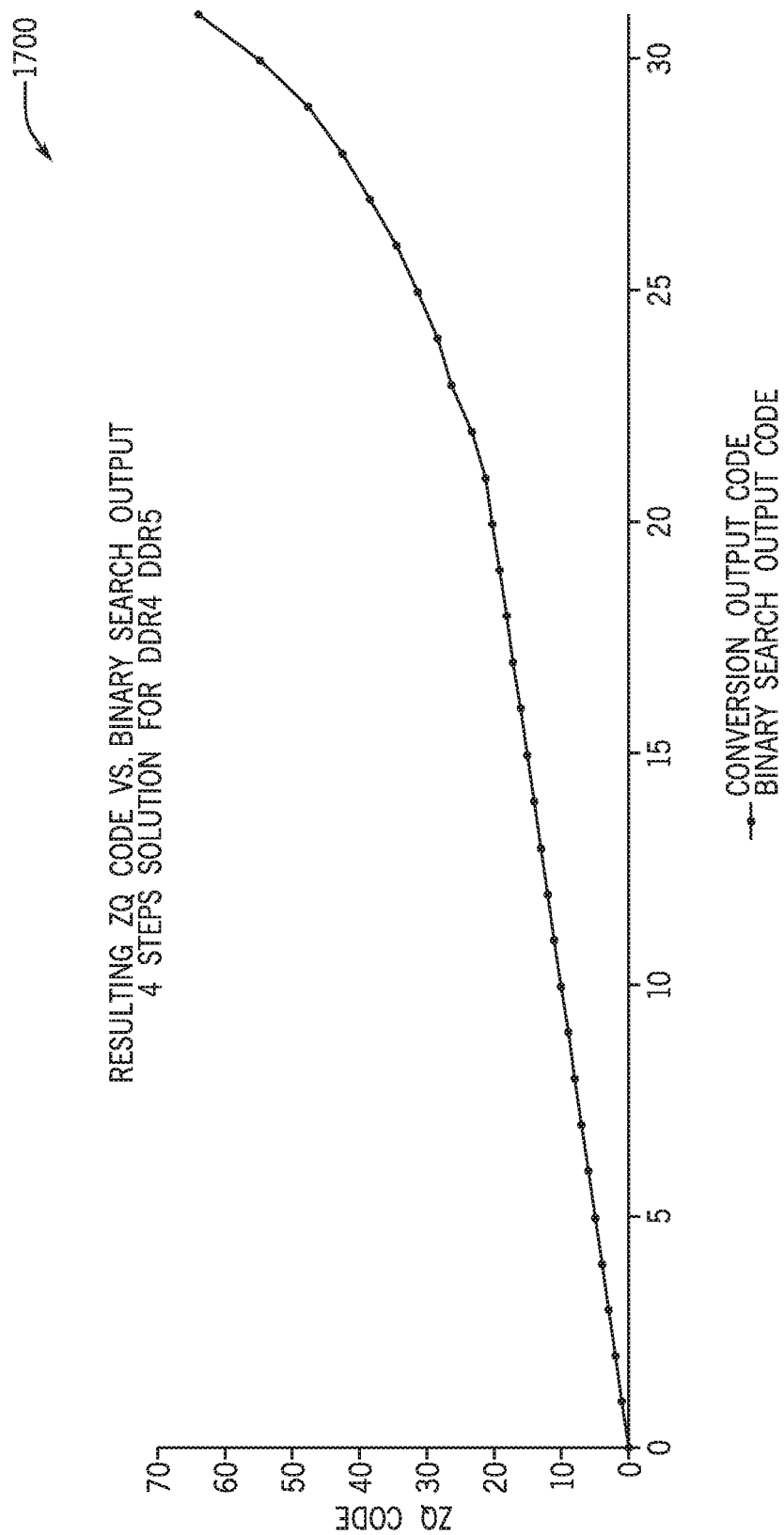
FIG. 17 depicts ZQCODE inputs and their converted ZQCODEs for a 4 compare solution, in accordance with an embodiment of the present disclosure.
Figure 18:
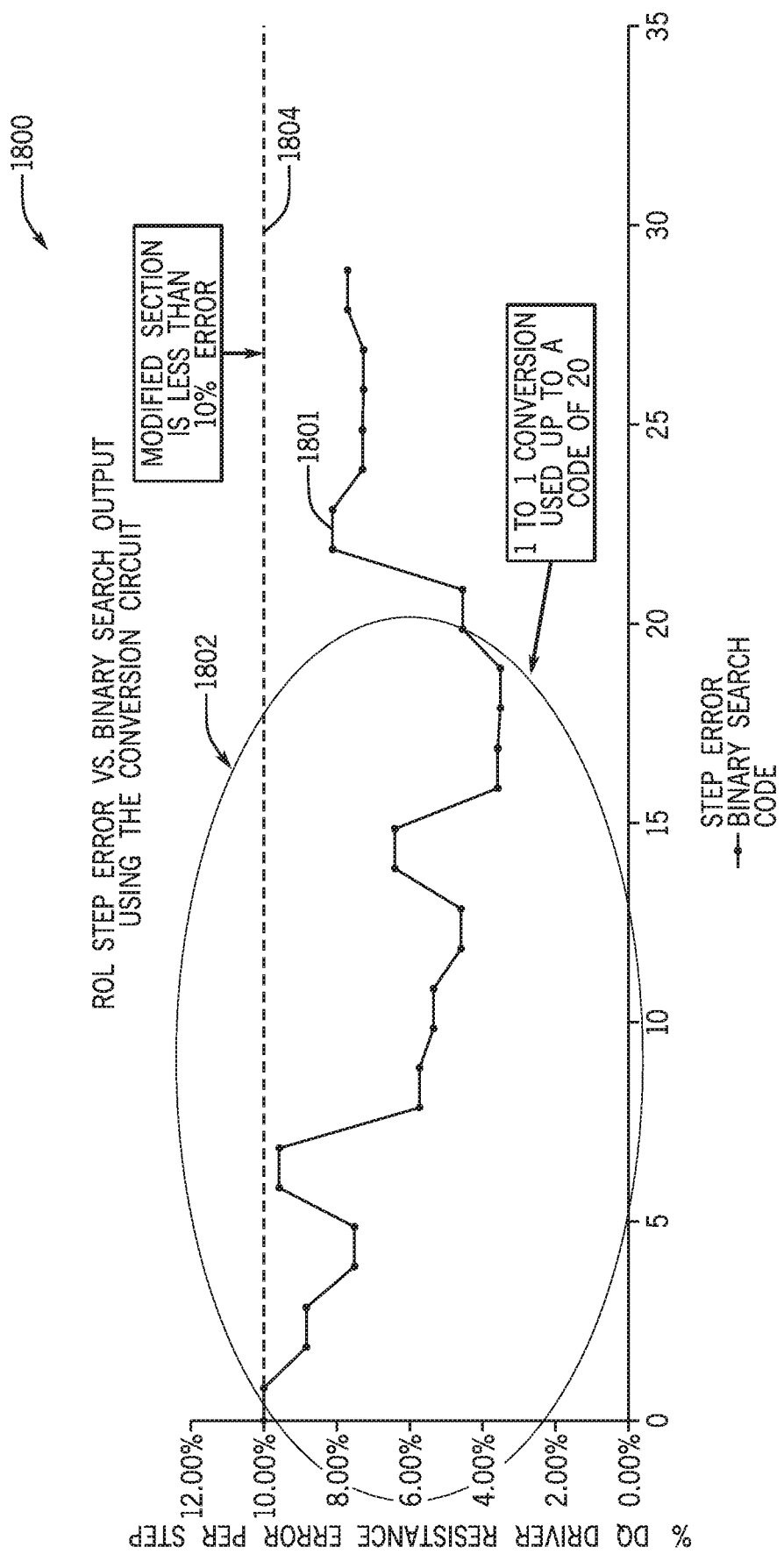
FIG. 18 is data plot diagram illustrating a resistance error per step versus binary search output for the 4 compare solution, in accordance with an embodiment of the present disclosure.
Figure 19:
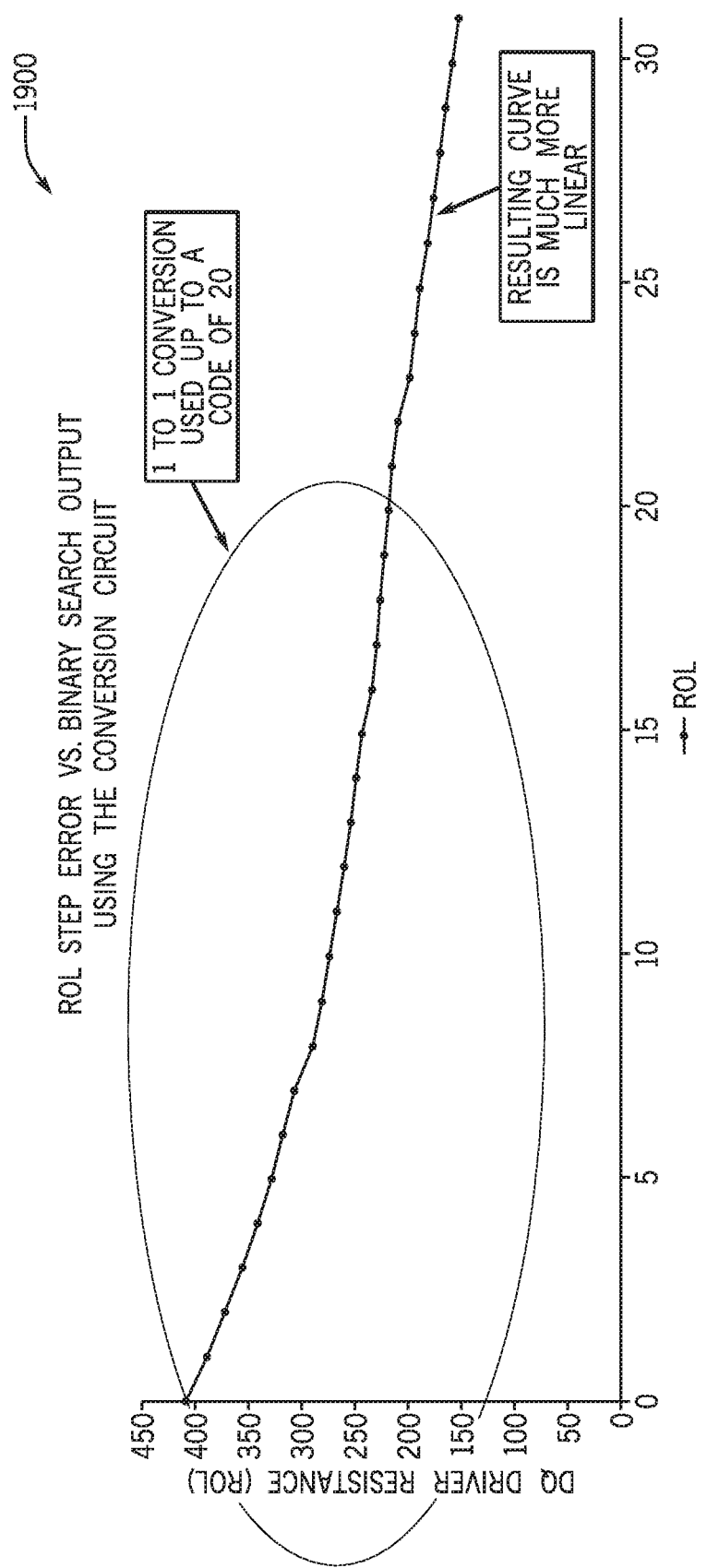
FIG. 19 is a data plot diagram illustrating driver resistance versus binary search output for the 4 compare solution, in accordance with an embodiment of the present disclosure.

As mentioned above, the current techniques may result in a reduced number of search steps required to maintain a desired margin of error. For example in LP4 and LP5, 6 traditional comparisons may be trimmed to 5 comparisons. Further, for DDR4 and DDR5, 5 traditional comparisons may be trimmed to 4 comparisons. FIGS. 14-16 illustrate data related to LP4 and LP5 embodiments and FIGS. 17-19 illustrate data related to DDR4 and DDR5 embodiments.

a. 5 Compare Solution for LP4 and LP5

Starting first with the 5 compare solutions for LP4 and LP5, FIG. 14 depicts a table 1400 of ZQCODE inputs and their converted ZQCODEs for a 5 compare solution (e.g., for LP4 and LP5), in accordance with an embodiment of the present disclosure. As illustrated, in the binary search output codes indicated by the x-axis, there is a linear mapping for the range of approximately 0-40 with the conversion ZQCODE, indicated by the y-axis. This is due to the high variation in resistance values at the lower ZQCODEs, as illustrated in FIG. 3. However, in the 40-64 range, the conversion ZQCODEs take relatively larger jumps, such that a greater magnitude of ZQCODE change may occur at the range where relatively little resistance changes occur from ZQCODE to neighboring ZQCODE.

FIG. 15 is data plot diagram 1500 that illustrates a binary search output (x-axis) vs. resistance error per step (y-axis), in accordance with an embodiment of the present disclosure. Error plot 1501 illustrates the error for the range of binary search codes. As illustrated, in the range 1502, a 1-to-1 conversion is used, such that the error rate is unaffected by the current technique. However, in the range of binary search codes after 40, the error plot 1501 is under the 5% error margin (indicated by marker 1504). Accordingly, the current techniques provide less than 5% error, despite reducing the number of binary search steps from 6 to 5.

FIG. 16 is a data plot diagram 1600, illustrating the driver resistance vs. binary search output relationship after the ZQCODE conversion techniques described herein are implemented for a 5 compare solution (e.g., for LP4 and LP5). As may be appreciated, the driver resistance vs. binary search output relationship is flattened/more linear when compared with the driver resistance vs. search output illustrated in FIG. 3. As discussed above, this linearization, made possible through use of the conversion circuit, enables reduction of the binary search for LP4 and LP5 to 5 search steps.

b. 4 Compare Solution for DDR4 and DDR5

Turning now to the 4 compare solutions for DDR4 and DDR5, FIG. 17 depicts a table 1700 of ZQCODE inputs and their converted ZQCODEs for a 4 compare solution (e.g., for DDR4 and DDR5), in accordance with an embodiment of the present disclosure. As illustrated, in the binary search output codes indicated by the x-axis, there is a linear mapping for the range of approximately 0-20 with the conversion ZQCODE, indicated by the y-axis. This is due to the high variation in resistance values at the lower ZQCODEs, as illustrated in FIG. 3. However, in the 20-32 range, the conversion ZQCODEs take relatively larger jumps, such that a greater magnitude of ZQCODE change may occur at the range where relatively little resistance changes occur from ZQCODE to neighboring ZQCODE.

FIG. 18 is data plot diagram 1800 that illustrates a binary search output (x-axis) vs. resistance error per step (y-axis), in accordance with an embodiment of the present disclosure. Error plot 1801 illustrates the error for the range of binary search codes. As illustrated, in the range 1802, a 1-to-1 conversion is used, such that the error rate is unaffected by the current technique. However, in the range of binary search codes after 20, the error plot 1801 is under the 10% error margin (indicated by marker 1804). Accordingly, the current techniques provide less than 10% error, despite reducing the number of binary search steps from 5 to 4.

FIG. 19 is a data plot diagram 1900, illustrating the driver resistance vs. binary search output relationship after the ZQCODE conversion techniques described herein are implemented for a 5 compare solution (e.g., for DDR4 and DDR5). As may be appreciated, the driver resistance vs. binary search output relationship is flattened/more linear when compared with the driver resistance vs. search output illustrated in FIG. 3. As discussed above, this linearization, made possible through use of the conversion circuit, enables reduction of the binary search for DDR4 and DDR5 to 4 search steps.

As may be appreciated, the disclosed techniques provide improvement to ZQ calibration, resulting in more-efficient resistance calibration. For example, the number of search steps may be reduced, allowing more time for each of the search steps. This results in better noise immunity and timing margin, as this allows for more variability of the oscillator, allows for increased comparator response time, and/or allows for increased logic execution time.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications,

What is claimed is:

1. A semiconductor device, comprising:
one or more components susceptible to impedance variations;
ZQ calibration circuitry configured to:
perform a measurement of a resistance, voltage, impedance, or any combination thereof of the one or more components;
derive a ZQ calibration code (ZQCODE) based upon the measurement;
perform a comparison of the resistance, voltage, impedance, or any combination thereof of the one or more components to a reference value;
perform an adjustment to a calibration step based upon results of the comparison; and
perform an adjustment to an output resistance, voltage, or both based at least in part upon the calibration step; and
non-linearity compensation circuitry configured to compensate for a non-linear relationship between variation in a plurality of ZQ calibration codes and corresponding resistance variations, by adjusting:
a magnitude of the adjustment to the calibration step, wherein the magnitude is determined based upon a range within a set of ranges of ZQCODE values that the ZQCODE is in;
determine whether to increment or decrement the calibration step based upon the results of the comparison; and
perform a binary search, using the adjusted calibration step as an initial step and then stepping by iteratively halving a previously used step size until a threshold number of comparisons to the reference value are performed.

2. The semiconductor device of claim 1, wherein the non-linearity compensation circuitry is configured to adjust the magnitude of the adjustment to the calibration step.

3. The semiconductor device of claim 1, wherein the non-linearity compensation circuitry is configured to set the magnitude of the adjustment to the calibration step as follows:
when the ZQCODE is in a first range, set the magnitude of the adjustment to the calibration step to 16 for incrementing or 16 for decrementing;
when the ZQCODE is in a second range, set the magnitude of the adjustment to the calibration step to 16 for incrementing or 8 for decrementing;
when the ZQCODE is in a third range, set the magnitude of the adjustment to the calibration step to 8 for incrementing or 4 for decrementing; and
when the ZQCODE is in a fourth range, set the magnitude of the adjustment to the calibration step to 4 for incrementing or 4 for decrementing.

4. The semiconductor device of claim 3, wherein the first range comprises greater than or equal to 32.

5. The semiconductor device of claim 3, wherein the third range comprises less than or equal to 8.

6. The semiconductor device of claim 3, wherein:
the second range comprises greater than or equal to 12 and less than 32; and
the third range comprises greater than or equal to 8 and less than 12.

7. The semiconductor device of claim 3, wherein:
the second range comprises greater than or equal to 16 and less than 32; and
the third range comprises greater than or equal to 8 and less than 16.

8. The semiconductor device of claim 3, wherein:
the second range comprises greater than or equal to 14 and less than 32; and
the third range comprises greater than or equal to 8 and less than 14.

9. The semiconductor device of claim 3, wherein the first range combined with the second range, the third range, and the fourth range cover an entire range of possible ZQCODEs that can be derived by the ZQ calibration circuitry.

10. The semiconductor device of claim 1, wherein the non-linearity compensation circuitry is configured to set the magnitude of the adjustment to the calibration step to a relatively higher value for a higher ZQCODE when compared to an adjustment magnitude for a lower value ZQCODE.

11. The semiconductor device of claim 1, wherein the threshold number of comparisons is 4 or 5.

12. The semiconductor device of claim 2, wherein the non-linearity compensation circuitry is configured to adjust the magnitude of the adjustment to the output resistance, voltage, or both.

13. The semiconductor device of claim 1, wherein the non-linearity compensation circuitry configured to compensate for a non-linear relationship between variation in a plurality of ZQ calibration codes and corresponding resistance variations, by adjusting the ZQCODE to a corresponding alternative ZQCODE of a plurality of alternative ZQCODES, wherein the plurality of alternative ZQCODES comprise adjustments to the plurality of ZQ calibration codes to create linear relationship between the plurality of ZQ calibration codes corresponding to the alternative ZQCODES and the corresponding resistance variations the alternative ZQCODE is a relatively higher value when the ZQCODE is relatively higher in a range of possible ZQCODEs.

14. The semiconductor device of claim 1, wherein the alternative ZQCODE is used in a subsequent calibration step, comprising performing a comparison of a resistance, voltage, impedance, or any combination thereof that is associated with the alternative ZQCODE to the reference value.

15. The semiconductor device of claim 1, comprising binary search logic configured to perform a binary search to obtain the ZQCODE.

16. A semiconductor device, comprising:
one or more components susceptible to impedance variations;
ZQ calibration circuitry configured to:
perform a measurement of a resistance, voltage, impedance, or any combination thereof of the one or more components;
derive a ZQ calibration code (ZQCODE) based upon the measurement;

perform a comparison of the resistance, voltage, impedance, or any combination thereof of the one or more components to a reference value;
perform an adjustment to a calibration step based upon results of the comparison; and
perform an adjustment to an output resistance, voltage, or both based at least in part upon the calibration step; and
non-linearity compensation circuitry configured to:
compensate for a non-linear relationship between variation in a plurality of ZQ calibration codes and corresponding resistance variations, by:
determining whether to increment or decrement the calibration step based upon the results of the comparison;
adjusting a magnitude of the adjustment to the calibration step, wherein the magnitude is determined based upon a range within a set of ranges of ZQCODE values that the ZQCODE is in, by setting the magnitude of the adjustment to the calibration step as follows:
when the ZQCODE is in a first range, set the magnitude of the adjustment to the calibration step to 16 for incrementing or 16 for decrementing;
when the ZQCODE is in a second range, set the magnitude of the adjustment to the calibration step to 16 for incrementing or 8 for decrementing;
when the ZQCODE is in a third range, set the magnitude of the adjustment to the calibration step to 8 for incrementing or 4 for decrementing; and
when the ZQCODE is in a fourth range, set the magnitude of the adjustment to the calibration step to 4 for incrementing or 4 for decrementing.

17. The semiconductor device of claim 16, wherein the first range comprises greater than or equal to 32.

18. The semiconductor device of claim 16, wherein the third range comprises less than or equal to 8.

19. The semiconductor device of claim 16, wherein:
the second range comprises greater than or equal to 12 and less than 32; and
the third range comprises greater than or equal to 8 and less than 12.

20. The semiconductor device of claim 16, wherein:
the second range comprises greater than or equal to 16 and less than 32; and
the third range comprises greater than or equal to 8 and less than 16.

21. The semiconductor device of claim 16, wherein:
the second range comprises greater than or equal to 14 and less than 32; and
the third range comprises greater than or equal to 8 and less than 14.

22. The semiconductor device of claim 16, wherein the first range combined with the second range, the third range, and the fourth range cover an entire range of possible ZQCODEs that can be derived by the ZQ calibration circuitry.

* * * * *